(12) United States Patent
Sekiya et al.

(10) Patent No.: US 6,380,673 B1
(45) Date of Patent: *Apr. 30, 2002

(54) ORGANIC ELECTROLUMINESCENCE DISPLAY

(75) Inventors: Mitsunobu Sekiya; Takashi Hirano, both of Kanagawa; Tetsuo Nakayama, Tokyo; Naoki Sano; Tatsuya Sasaoka, both of Kanagawa, all of (JP)

(73) Assignee: Sony Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/391,070

(22) Filed: Sep. 16, 1999

(30) Foreign Application Priority Data

Sep. 21, 1998 (JP) ............................................. 10-265838

(51) Int. Cl.[7] .................................................. H01J 1/62
(52) U.S. Cl. ........................................ 313/504; 313/500
(58) Field of Search ................................. 313/504, 505, 313/500, 509, 502; 345/76, 77

(56) References Cited

U.S. PATENT DOCUMENTS 5,276,380 A * 1/1994 Tang ........................... 313/504
5,384,517 A * 1/1995 Uno ............................ 315/169.3
5,858,564 A * 1/1999 Tamura et al. ............... 428/690
6,249,084 B1 * 1/2001 Yamana ....................... 313/504

* cited by examiner

Primary Examiner—Nimeshkumar D. Patel
Assistant Examiner—Thelma Sheree Clove
(74) Attorney, Agent, or Firm—Sonnenschein, Nath & Rosenthal

(57) ABSTRACT

An organic EL display that realizes low electric power consumption and display with high brightness by decreasing the resistance of the electrode on the scanning side is provided. The display device of the invention includes a substrate, first electrodes in a stripe form comprising a transparent conductive material formed on the substrate, an insulating film having prescribed openings formed on the first electrodes, an organic layer comprising an organic light emitting material formed on the openings and the insulating film, and second electrodes in of a stripe form formed on the organic layer, wherein the first electrodes comprise a material having a large resistance than a resistance of the second electrodes, the first electrodes and the seconds electrode are arranged to cross each other, the organic layer is formed only in the crossing part of the first electrodes and the second electrodes, a first circuit supplying a first electric current is connected to the first electrodes, and a second circuit supplying a second electric current larger than the first electric current is connected to the second electrodes.

30 Claims, 4 Drawing Sheets

ORGANIC ELECTROLUMINESCENCE DISPLAY

FIELD OF THE INVENTION

The present invention relates to an organic EL (electroluminescence) display having an organic EL device comprising an organic light emitting layer.

BACKGROUND OF THE INVENTION

In an organic EL display comprising numeral pixels each constituted by an organic electric field light emitting device (hereinafter referred to as an organic EL device), an electron and a hole are injected to an organic light emitting layer from a cathode and an anode, respectively, by applying a voltage to the organic EL device, and recombination of the electron and the hole occurs in the organic light emitting layer to cause emission of light.

Examples of the organic EL device equipped in an organic EL display include a single hetero type organic EL device shown in FIG. 1. The organic EL device comprises a transparent substrate 1, such as a glass substrate, having thereon an anode 2 comprising a transparent conductive film, such as ITO (indium tin oxide), and having further thereon an organic layer 5 comprising a hole transfer layer 3 and a light emitting layer 4, and a cathode 6 comprising aluminum, in this order.

In the organic EL device having such a constitution, a positive voltage is applied to the anode 2, and a negative voltage is applied to the cathode 6. A hole injected from the cathode 2 reaches the light emitting layer 4 through the hole transfer layer 3, and an electron injected from the cathode 6 reaches the light emitting layer 4, to cause recombination of the electron and the hole to occur in the light emitting layer 4. As a result, light having a prescribed wavelength is generated and emitted from the transparent substrate 1 as shown by the arrow in FIG. 1.

Accordingly, an organic EL display can be formed by arranging a large number of the organic EL devices in a matrix form, as described in the foregoing.

An example of the conventional organic EL display is shown in FIG. 2. The organic EL display shown in FIG. 2 comprises a transparent substrate 7 having thereon transparent electrodes 8 in a stripe form as an anode, and organic layers 11a, 11b, 11c et al. in a stripe form are formed further thereon to cross the transparent electrodes 8 at right angles, and cathodes 12 having the substantially same dimension as the organic layer 11a (11b and 11c) are formed on the organic layers 11a, 11b, 11c et al. The organic layers 11a, 11b and 11c have light emission characteristics corresponding to one of red (R), green (G) and blue (B), respectively, and thus the organic EL display becomes a full-color or multi-color display.

The mode of displaying an image in the color organic EL display shown in FIG. 2 will be described. In the color organic EL display, as shown in FIG. 3, a scanning circuit 13 is connected to the transparent electrodes 8, and a brightness signal circuit 14 is connected to the cathodes 12. A signal voltage varying with time is applied to the organic layers 11a to 11c at the point of intersection between the transparent electrodes 8 and the cathodes 12 by the scanning circuit 13 and the brightness signal circuit 14, and thus the respective organic layers 11a to 11c emit light. By using such a mode of control, the organic EL display can also function as an image reproduction apparatus.

However, the organic EL display involves the following problems.

In the case where the organic EL device having several hundreds scanning lines is driven in a simple matrix mode, an electric current of about 1 $A/cm^2$ is necessary to ensure sufficient brightness. In this case, while depending on the size of the display, an electric current of about from 0.5 to 1 A momentarily flows through the transparent electrodes 8 on the side of the scanning circuit 13.

ITO generally used as the transparent electrodes 8 has a resistance larger than a metal, such as aluminum, and its alloy by about 100 times, and therefore, when a large electric current of about from 0.5 to 1 A flows therein, a large voltage drop occurs in the transparent electrodes 8. When such a large voltage drop occurs in the transparent electrodes 8, the voltage applied to the respective organic EL devices in the organic EL display becomes uneven to considerably deteriorate the display performance of the organic EL display.

In other words, in the case where the display is driven in the single matrix mode, while depending on the size of the display, the electric current flowing the electrode of the scanning side becomes larger than the electric current flowing in the electrode of the brightness signal side by 100 to 1,000 times due to the driving principles thereof. However, in the organic EL display, because a large electric current flows in the transparent electrodes 8 having a large resistance, a large voltage drop occurs in the transparent conductive film constituting the transparent electrodes 8, and the voltage applied to the organic layers 11a, 11b, 11c, et al. constituting the respective pixels becomes uneven, so as to deteriorate the display performance and to increase the consuming electric power in the transparent electrodes 8.

In the color organic EL display shown in FIG. 2, because the organic layers 11a, 11b, 11c, et al. are formed along the lengthwise direction of the cathodes 12 in a stripe form under the whole surface thereof, a brightness signal necessary for each colors, R, G and B, should be applied from the cathodes 12. Therefore, it is necessary that the brightness signal circuit 14 is connected to the cathodes 12, and the scanning circuit 13 is connected to the transparent electrodes 8.

Because the electric power consumed in the transparent electrodes 8 becomes large as described above, the property of low power consumption of the whole organic EL display is impaired. Therefore, in order to obtain an organic EL display of a low electric power consumption, it is necessary to lower the resistance of the electrode of the scanning side to decrease the voltage drop.

As measures of lowering the resistance of the electrode of the scanning side, a technique is described in JP-A-5-307997 in that a metallic wiring is attached to transparent electrodes. According to this technique, a metal with low resistance is provided at a part between the transparent electrodes and the organic layer to lower the resistance of the scanning electrode.

However, in order to sufficiently lower the resistance by this technique, the area of the metallic wiring attached to the transparent electrodes is necessarily made as large as possible. When the area of the metallic wiring is large, it covers the organic layer 11a (11b and 11c) to be a light emission part, and as a result, the light emission area of the organic EL device becomes small to deteriorate the light emission efficiency.

While it is also considered to lower the resistance by increasing the thickness of the metallic film, such measures may cause a short circuit between the anode and the cathode and unevenness in thickness of the organic layer.

SUMMARY OF THE INVENTION

The invention has been developed in view of the circumstances described above.

An object of the invention is to provide an organic EL display that realizes low electric power consumption and display with high brightness by decreasing the resistance of the electrode on the scanning side.

The invention relates to a display device comprising a substrate,
first electrodes in a form of a stripe comprising a transparent conductive material formed on the substrate,
an insulating film having prescribed openings formed on the first electrodes,
an organic layer comprising an organic light emitting material formed on the openings and the insulating film, and
second electrodes in a form of a stripe formed on the organic layer,
wherein the first electrodes comprised of a material having a larger resistance than a resistance of the second electrodes,
the first electrodes and the second electrodes are arranged to cross each other,
the organic layer is formed only in the crossing part of the first electrodes and the second electrodes,
a first circuit supplying a first electric current is connected to the first electrodes, and
a second circuit supplying a second electric current larger than the first electric current is connected to the second electrodes.

The substrate may be a transparent substrate.

The second electrode may be comprised of a metal or an alloy.

The openings formed in the insulating layer may have a substantially rectangular shape in a plan view, and may be formed to have a tapered shape, in which the inner wall of the openings is gradually slanted toward the outside from the lower end to the upper end of the inner wall.

The organic layer may be formed in the form of plural independent islands, each of which has a substantially rectangular shape, to fill up the openings, and the width of the organic layer at the upper surface thereof in the width direction of the first electrodes may be larger than the width of the first electrodes.

The second electrodes may be formed to cover the side surface and the upper surface of the organic layer.

In the organic EL display of the invention, because the plural organic layers may be provided in the form of independent substantially rectangular islands, the arrangement and combination of the organic layer with the cathode and the anode can be arbitrarily conducted, and therefore the selection and arrangement of the pixel comprising the organic EL device and the electrode to be a constitutional component of the device. Accordingly, in the case of, for example, a color organic EL display, a second electrodes comprising a metal or an alloy having a small resistance can be used as an electrode of the scanning side, in which a larger electric current flows.

Because the inner wall of the openings formed in the insulating layer may have a tapered shape, in which the inner wall is gradually slanted toward the outside from the lower end to the upper end of the inner wall, the step coverage of the organic layer provided to fill up the openings c an be improved, and thus breakage of the second electrodes formed to cover the organic layer can be prevented.

Furthermore, because the width of the organic layer at the upper surface thereof in the width direction of the first electrodes may be larger than the width of the first electrodes, the contact area of the organic layer with the first electrodes, i.e., the area of the openings at the bottom thereof, can be made large.

BRIEF DESCRIPTION OF THE DRAWINGS

FIGS. 4(A) to 4(D) are views showing the schematic structure of one embodiment of the organic EL display according to the invention, in which FIG. 4(A) is a plan view of an important part, FIG. 4(B) is a cross sectional view on line B—B in FIG. 4(A), FIG. 4(C) is an enlarged plan view of the part C in FIG. 4(A), and FIG. 4(D) is a perspective view with the connection to the driving circuits.

DESCRIPTION OF THE EMBODIMENT

The invention will be described in detail with reference to the following embodiment.

FIGS. 4(A) to 4(D) show a schematic structure of one embodiment of the organic EL display according to the invention, in which numeral 20 denotes an organic EL display.

Figure 1:
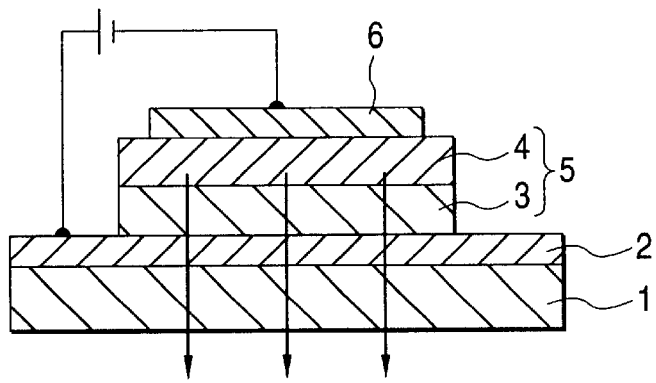
FIG. 1 is a cross sectional view showing the schematic structure of the conventional single hetero type organic EL device.
Figure 2:
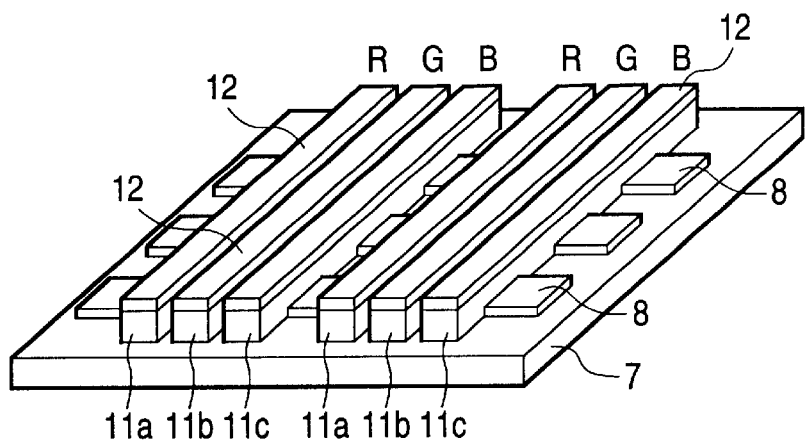
FIG. 2 is a perspective view showing the schematic structure of the conventional organic EL display.
Figure 3:
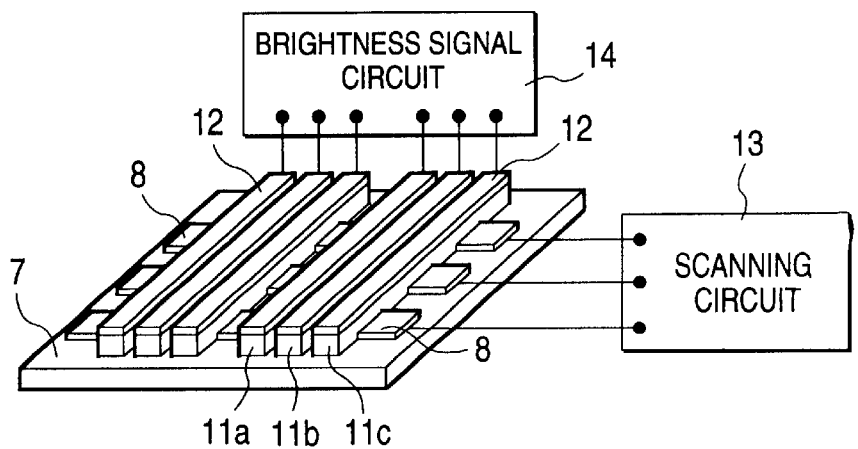
FIG. 3 is a perspective view showing the organic EL display shown in FIG. 2 connected to driving circuits.
Figure 4:
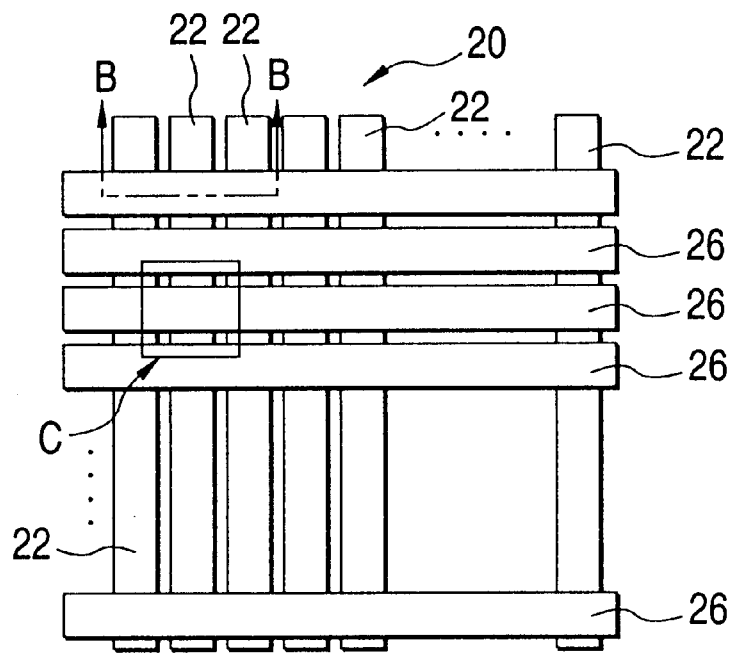
Figure 4:
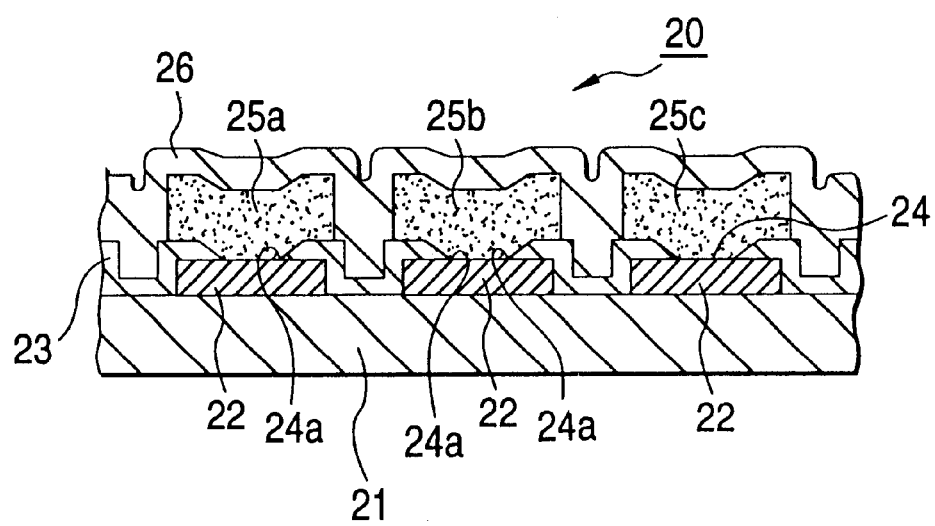
Figure 4:
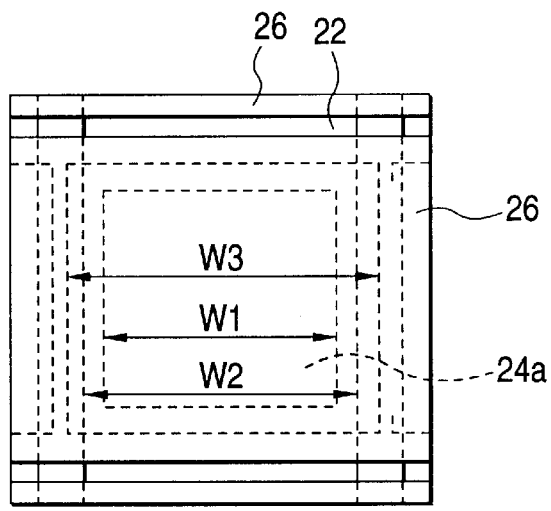
Figure 4:
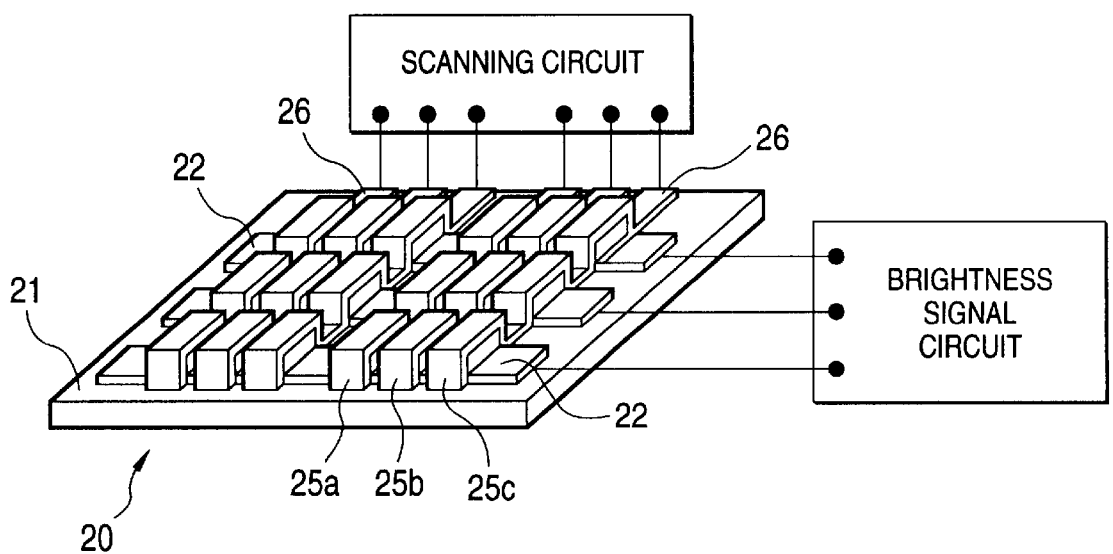

In the organic EL display 20, as shown in FIG. 4(B), plural first electrodes (anode) 22 in a stripe form comprised of a transparent conductive material, which is ITO in this embodiment, are formed in parallel on a transparent substrate 21, and an insulating layer 23 comprised of a polyimide is formed to cover the first electrodes 22s. In the insulating layer 23, a large number of openings 24 in a substantially rectangular shape are formed to form numeral dots directly above the first electrodes 22, so as to expose the surface of the first electrodes 22 to the outside.

The openings 24 are formed directly above the first electrodes 22 at the point of intersection with second electrodes 26 described later, which is formed to have a tapered shape, in which the inner wall thereof is gradually slanted toward the outside from the lower side to the upper side of the inner wall. That is, the rectangular shape at the bottom of the openings 24 is smaller than the rectangular shape at the upper side of the openings 24, and as shown in FIG. 4(C), the width W1 of the openings 24 along the width direction of the first electrodes 22 is smaller than the width W2 of the first electrodes 22. Accordingly, the bottom 24a of the openings 24 is not deviated from the surface of the first electrodes 22, and the openings 24 are positioned directly above the first electrodes 22.

Furthermore, as shown in FIG. 4(B), organic layers 25a, 25b, 25c, et al. are formed on the first electrodes 22 from the inside of the openings 24 over the insulating layer 23. The organic layers 25a, 25b, 25c, et al. are connected to the first electrodes 22 through the openings 24, and are formed in a rectangular shape as a plan view to substantially independent from each other as shown in FIG. 4(C). They are larger than the bottom 24a of the openings 24, and the width W3 thereof along the width direction of the first electrodes 22 is larger than the width W2 of the first electrodes 22.

The organic layers 25a, 25b, 25c, et al. each comprises an light emitting layer comprised of an organic light emitting material corresponding one color among red (R), green (G) and blue (B), and further comprises a hole transfer layer, an electron transfer layer and a hole blocking layer accumulated. In this embodiment, the light emitting layer of the organic layer 25a, the light emitting layer of the organic layer 25b and the light emitting layer of the organic layer 25c correspond to red (R), green (G) and blue (B), respectively.

On the transparent substrate 21, plural second electrodes 26 in a stripe form are formed on the insulating layer 23, and are arranged to cross the first electrodes 22 at substantially right angles. The second electrodes 26 are comprised of a metal or an alloy having a light shielding property and a low resistance, which is aluminum in this example. The second electrodes 26 are formed to cover the side surface and the upper surface of the organic layers 25a, 25b, 25c, et al. Accordingly, in the constitution described above, the organic layers 25a, 25b, 25c, et al. are arranged independently at the points of intersection of the first electrodes 22 and the second electrodes 26.

The second electrodes 26 covering the upper surface of the organic layer 25a, 25b, 25c, et al. in this example, as shown in FIG. 4(B), cover not only the upper surface of the organic layer 25a, 25b, 25c, et al., but also the side surface thereof exposed from the insulating layer 23. As a result, when light emission occurs in the organic layer 25a (25b and 25c), the light is not transferred to the upper surface or the side surface, but is transmitted from the lower surface to the transparent substrate 21 through the first electrodes 22 as transparent electrodes, and the light is further emitted to the outside thereof.

Figure 5:
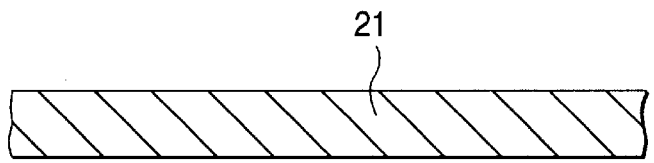
FIGS. 5(A) to 5(F) are cross sectional views of an important part showing the process for producing the organic EL display shown in FIGS. 4(A) to 4(D).
Figure 5:
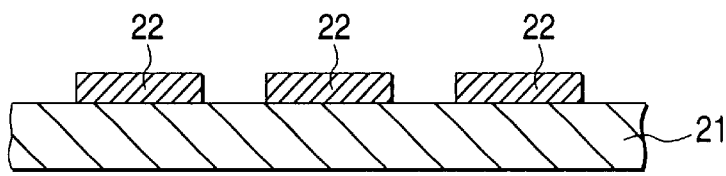
Figure 5:
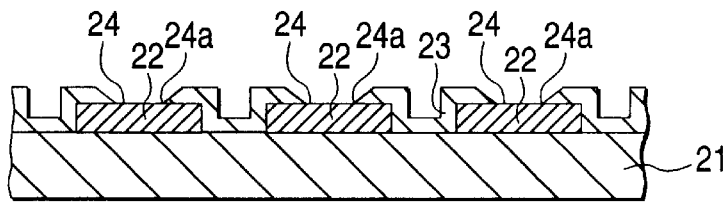
Figure 5:
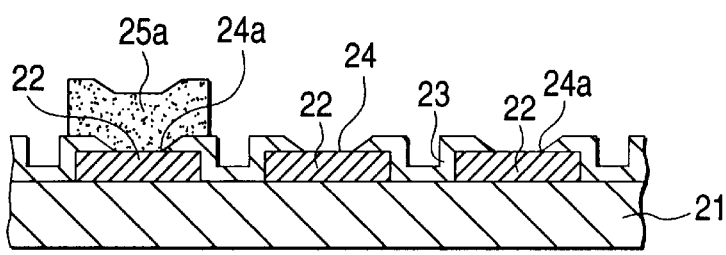
Figure 5:
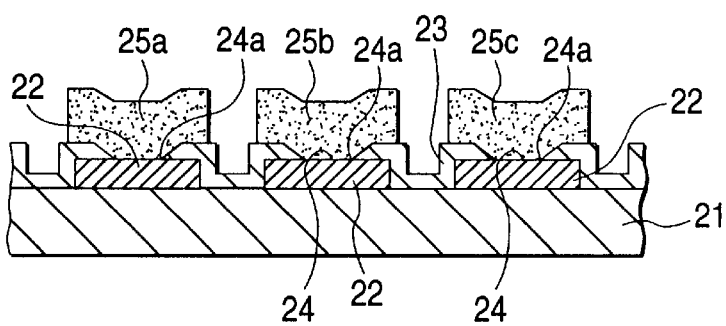
Figure 5:
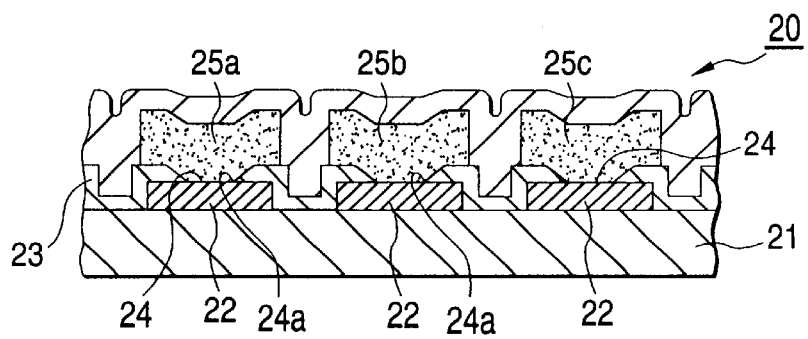

In order to produce the organic EL display 20 having such a structure, a transparent substrate 21 comprised of glass is firstly prepared as shown in FIG. 5(A). Then a film of a transparent conductive material having excellent light transmissibility and conductivity, which is ITO in this embodiment, is formed on the transparent substrate 21 by, for example, a physical method, such as sputtering method, and first electrodes 22 in a stripe form are formed as shown in FIG. 5(B) by using known lithography technique and etching technique.

An insulating material, which is a polyimide in this embodiment, is coated on the transparent substrate 21 to cover the first electrodes 22 by a spin coating method, and openings 24 are formed above the first electrodes 22 by using a known lithography technique to obtain an insulating layer 23 as shown in FIG. 5(C). Upon formation of the openings 24, they are formed to have an inner wall having a tapered shape, and the bottom 24a thereof is positioned directly above the first electrodes 22, i.e., the openings 24 are mounted onto the first electrodes 22.

Because the width W3 of organic layers 25a, 25b, 25c, et al. formed later is larger than the width W2 of the first electrodes 22 as shown in FIG. 4(C), the area of the openings 24, particularly, the bottom 24a thereof, can be sufficiently made large in comparison to the case where the width W3 is smaller than the width W2, to increase the light emitting efficiency.

The polyimide is used as the insulating layer 23 since it has a good insulating property and a good adhesion property to the underlayer. Other insulating materials than the polyimide may also be used as far as they have such properties.

The organic layer 25a for red (R) is formed in the openings 24 and on the insulating layer 23 in the vicinity of the openings by using a vapor deposition mask having plural rectangular openings by a vapor deposition method as shown in FIG. 5(D). Subsequently, the organic layer 25b for green (G) and the organic layer 25c for blue (B) are then formed in the same manner as the organic layer 25a as shown in FIG. 5(E).

Upon forming the organic layers 25a, 25b, 25c, et al., vapor deposition is conducted by using the vapor deposition masks for each colors exchanged once by once, or using the same vapor deposition mask shifted for each colors. Therefore, the resulting organic layers 25a, 25b, 25c, et al. are accumulated in an independent rectangular shape.

Since the width W3 of the organic layers 25a, 25b, 25c, et al. is larger than the width W2 of the first electrodes 22 as described above, there is a case where the adjacent organic layers are partly in contact with each other due to patterning deviation. However, because the part in the organic layers 25a, 25b, 25c, et al. that actually contributes to light emission is a part directly sandwiched by the first electrodes 22 and the second electrodes 26, i.e., the part directly above the bottom 24a of the openings 24, there occurs no problem on display characteristics even though the adjacent organic layers are partly in contact with each other. Even though the adjacent organic layers are partly in contact with each other, the organic layers are included in the form of substantially independent island in the invention.

Then second electrodes 26 in the stripe form are formed by using a vapor deposition mask having openings pattern of a stripe form by using a physical film formation method, such as a sputtering method and a vapor deposition method, so as to cross the first electrodes 22 at substantially right angles and to cover the organic layers 25a, 25b, 25c, et al., as shown in FIG. 5(F).

An insulating layer (not shown in the figure) is then formed to cover the second electrodes 26 to obtain a full-color organic EL display 20.

As a method for forming the organic layers 25a, 25b, 25c, et al., and the second electrodes 26, other patterning methods than the vapor deposition mask method, such as a lithography technique and an etching technique, may be used.

In the organic EL display 20, because the organic layers 25a, 25b and 25c are formed in a rectangular in a plan view and substantially independent form, in the case where it is driven by the simple matrix mode, a brightness signal circuit can be connected to the first electrodes 22, and a scanning circuit can be connected to the second electrodes 26.

When the display is driven by the simple matrix mode by connecting the brightness signal circuit and the scanning circuit to the electrodes, the voltage drop that occurs in the first electrodes 22, as transparent electrodes, can be decreased, and thus the voltage applied to the organic layers 25a, 25b, 25c, et al. constituting the respective pixels can be uniform, so that the brightness of light emission can be made uniform.

Furthermore, the electric power consumed in the first electrodes 22 can be reduced to an extent that can be ignored, and thus the consuming electric power of the display can be lowered.

Because the openings 24 in the insulating layer 23 have the tapered shape, in which the inner wall is gradually slanted toward the outside from the lower side to the upper side thereof, the step coverage of the organic layers 25a, 25b and 25c provided to fill up the openings 24 can be improved, and thus the breakage of the second electrodes 26 formed to cover the organic layers 25a, 25b and 25c can be prevented.

Because the width W3 of the organic layers 25a, 25b and 25c on the upper surface thereof in the width direction of the first electrodes 22 is larger than the width W2 of the second electrodes 22, the area of the bottom 24a of the openings 24 can be sufficiently large in comparison to the case where the width W3 is smaller than the width W2. Therefore, the area of the part of the organic layers 25a, 25b and 25c directly in contact with the first electrodes 22, which is the part actually contributes to the light emission, can be made large, and thus high brightness of the display can be realized.

In the organic EL display 20, because the organic layers 25a, 25b and 25c are in the rectangular substantially independent form, the arrangement of 25a, 25b and 25c is arbitrary, and accordingly, the arrangement of the pixel units constituted with the respective organic layer 25a (25b and 25c) is arbitrary. Therefore, the pixels corresponding to red (R), green (G) and blue (B) can be arranged, for example, in a delta form.

In the organic EL display 20, because the organic layers 25a, 25b and 25c are in the rectangular, substantially independent form, and the upper surface and the side surface of the organic layers 25a, 25b and 25c are covered with the second electrodes 26, when light emission occurs in the organic layer 25b (25a and 25c), the light is not transmitted to the upper surface or the side surface but is reflected thereby, and as a result, substantially the whole part of the light is transmitted to the transparent substrate 21 through the first electrodes 22 as transparent electrodes, and is further emitted to the outside thereof.

Therefore, the light generated in the organic layers 25a, 25b, 25c, et al. can be effectively utilized, and thus display can be conducted with high brightness and excellent color reproducibility. Such an effect can also be obtained in a monochrome organic EL display, as well as in a color organic EL display.

While the second electrodes 26 are formed in a stripe form having the same width throughout the whole surface in this embodiment, the second electrodes are not particularly limited in the invention as far as it has a plane form capable of covering the upper surface of the organic layers 25a, 25b and 25c, and for example, it may be in a form of stripe, the width of which is partly narrowed.

While the second electrodes 26 are provided directly on the organic layers 25a, 25b, 25c, et al. in this embodiment, it is possible that a metallic film (not shown in the figure) having the substantially same size as the upper surface of the organic layers 25a, 25b, 25c, et al. is provided on the organic layers, and the second electrodes 26 are formed thereon, and in alternative, it is also possible that a metallic film (not shown in the figure) having such a dimension that covers the upper surface and the side surface of the organic layers 25a, 25b, 25c, et al., and the second electrodes 26 are formed thereon.

While the organic EL display of the invention is applied to a color organic EL display in this embodiment, the invention can be applied to a monochrome organic EL display, and can also be applied to an organic EL display of an active matrix type driven by a TFT, as well as the organic EL display driven by the simple matrix mode.

As described in the foregoing, in the organic EL display according to the invention, because the plural organic layers are provided at the point of intersection of the first electrodes and the second electrodes in a substantially independent island form, the arrangement and combination of the organic layers with the cathode and the anode can be arbitrarily conducted, and therefore the selection and arrangement of the pixel comprising the organic EL device and the electrode to be a constitutional component of the device. Accordingly, in the case of, for example, a color organic EL display, second electrodes comprised of a metal or an alloy having a small resistance can be used as an electrode of the scanning side, in which a larger electric current flows.

By using such second electrodes having a small resistance as an electrode of the scanning side, in which a larger electric current flows, because no large electric current flows in the first electrodes comprised of a transparent conductive material having a large resistance, unevenness in light emission in the respective pixels due to voltage drop can be suppressed to the minimum level, and deterioration in display performance can be prevented. Since a large electric current does not flow in the first electrodes of a large resistance, the electric power consumed in the first electrodes can also be made small, and as a result, the consuming electric power of the display can be decreased.

Furthermore, because the inner wall of the openings in the insulating layer is in a tapered shape, in which the inner wall is gradually slanted toward the outside from the lower end to the upper end of the inner wall, the step coverage of the organic layer formed to fill up the openings can be improved, and thus breakage of the second electrodes formed to cover the organic layer can be prevented.

Furthermore, because the width of the organic layer on the upper surface thereof in the width direction of the first electrodes is made larger than the width of the first electrodes, the area of the bottom of the openings in the insulating layer can be sufficiently made large in comparison to the case where the width of the organic layer is smaller than the width of the first electrodes. Therefore, the area of the organic layer that is directly in contact with the first electrodes, which actually contributes to light emission, can be made large, and thus the display can have high brightness. At the same time, in the case where, for example, the same brightness as that obtained by a display having a width of the organic layer smaller than the width of the first electrodes is intended to obtain, the reliability of the display can be increased by decreasing the driving voltage.

What is claimed is:

1. A display device, comprising
   a substrate;
   a first electrode in a form of a stripe comprised of a transparent conductive material formed on the substrate;
   an insulating film having prescribed opening formed on the first electrode, wherein the prescribed opening is formed to have a tapered shape;
   an organic layer comprising an organic light emitting material formed on the opening and the insulating film; and
   a second electrode in a form of a stripe formed on the organic layer,
   wherein the first electrode comprises a material having a larger resistance than a resistance of the second electrode,
   the first electrode and the second electrode are arranged to cross each other,
   the organic layer is formed only in the crossing part of the first electrode and the second electrode,
   a first circuit configured to supply a first electric current is connected to the first electrode, and
   a second circuit configured to supply a second electric current larger than the first electric current is connected to the second electrode.

2. A display device as claimed in claim 1, wherein the opening is provided within two borders of the first electrode, the organic layer is provided inside the opening, and an upper part of the organic layer is wider than the first electrode.

3. A display device as claimed in claim 2, wherein the tapered shape extends outward from a surface of the first electrode to a surface of the insulating film.

4. A display device as claimed in claim 1, wherein the second electrode is formed to cover a side surface and an upper surface of the organic layer.

5. A display device as claimed in claim 1, wherein the first electrode comprises indium tin oxide.

6. A display device as claimed in claim 1, wherein the first circuit is a circuit that is configured to provide a brightness signal, and the second circuit is a circuit that is configured to provide a scanning signal.

7. A display device as claimed in claim 1, wherein the insulating film comprises a polyimide.

8. A display device as claimed in claim 1, wherein the display device further comprises a metallic film formed between the second electrode and the organic layer.

9. A display device as claimed in claim 8, wherein the metallic film is formed to cover a side surface and an upper surface of the organic layer.

10. A display device as claimed in claim 1, wherein the display device is configured to be driven by a thin film transistor.

11. A display device, comprising,
a transparent substrate;
a first electrode in a form of a stripe comprising a transparent conductive material formed on the substrate;
an insulating film having prescribed opening formed on the first electrode;
an organic layer comprising an organic light emitting material formed on the opening and the insulating film; and
a second electrode in a form of a stripe formed on the organic layer,
wherein the first electrode comprises a material having a large resistance than a resistance of the second electrode,
the first electrode and the second electrode are arranged to cross each other,
the organic layer is formed only in the crossing part of the first electrode and the second electrode,
an upper part of the organic layer is wider than the first electrode,
a first circuit configured to supply a first electric current is connected to the first electrode, and
a second circuit configured to supply a second electric current larger than the first electric current is connected to the second electrode.

12. A display device as claimed in claim 11, wherein the opening is provided inside the first electrode and the organic layer is provided at least inside the opening.

13. A display device as claimed in claim 11, wherein the opening is formed to have a tapered shape.

14. A display device as claimed in claim 11, wherein the second electrode is formed to cover a side surface and an upper surface of the organic layer.

15. A display device as claimed in claim 11, wherein the first electrode comprises indium tin oxide.

16. A display device as claimed in claim 11, wherein the first circuit is a circuit that is configured to provide a brightness signal, and the second circuit is a circuit that is configured to provide a scanning signal.

17. A display device as claimed in claim 11, wherein the insulating film comprises a polyimide.

18. A display device as claimed in claim 11, wherein the display device further comprises a metallic film formed between the second electrode and the organic layer.

19. A display device as claimed in claim 18, wherein the metallic film is formed to cover a side surface and an upper surface of the organic layer.

20. A display device as claimed in claim 11, wherein the display device is configured to be driven by a thin film transistor.

21. A display device, comprising
a substrate;
a first electrode in a form of a stripe comprised of a transparent conductive material formed on the substrate;
an insulating film having prescribed opening formed on the first electrode, wherein the prescribed opening is formed to have a tapered shape;
an organic layer comprising an organic light emitting material formed on the opening and the insulating film; and
a second electrode in a form of a stripe formed on the organic layer,
wherein the first electrode comprises a material having a larger resistance than a resistance of the second electrode,
the first electrode and the second electrode are arranged to cross each other,
the organic layer is formed only in the crossing part of the first electrode and the second electrode,
a first circuit configured to supply a first electric current is connected to the first electrode, and
a second circuit configured to supply a second electric current larger than the first electric current is connected to the second electrode,
wherein the opening is provided within two borders of the first electrode, the organic layer is provided inside the opening, and an upper part of the organic layer is wider than the first electrode.

22. A display device as claimed in claim 21, wherein the tapered shape extends outward from a surface of the first electrode to a surface of the insulating film.

23. A display device as claimed in claim 21, wherein the second electrode is formed to cover a side surface and an upper surface of the organic layer.

24. A display device as claimed in claim 21, wherein the insulating film comprises a polyimide.

25. A display device as claimed in claim 21, wherein a metallic film is formed to cover a side surface and an upper surface of the organic layer.

26. A display device, comprising,
a transparent substrate;
a first electrode in a form of a stripe comprising a transparent conductive material formed on the substrate;
an insulating film having prescribed opening formed on the first electrode;
an organic layer comprising an organic light emitting material formed on the opening and the insulating film; and
a second electrode in a form of a stripe formed on the organic layer,
wherein the first electrode comprises a material having a large resistance than a resistance of the second electrode,
the first electrode and the second electrode are arranged to cross each other,
the organic layer is formed only in the crossing part of the first electrode and the second electrode,
an upper part of the organic layer is wider than the first electrode, a first circuit configured to supply a first electric current is connected to the first electrode, and a second circuit configured to supply a second electric current larger than the first electric current is connected to the second electrode, wherein the opening is provided inside the first electrode and the organic layer is provided at least inside the opening.

27. A display device as claimed in claim 26, wherein the opening is formed to have a tapered shape.

28. A display device as claimed in claim 26, wherein the second electrode is formed to cover a side surface and an upper surface of the organic layer.

29. A display device as claimed in claim 26, wherein the insulating film comprises a polyimide.

30. A display device as claimed in claim 26, wherein a metallic film is formed to cover a side surface and an upper surface of the organic layer.

* * * * *